United States Patent
Knieser et al.

(10) Patent No.: US 6,569,701 B2
(45) Date of Patent: May 27, 2003

(54) METHOD FOR FABRICATING AN ISOLATED MICROELECTROMECHANICAL SYSTEM DEVICE

(75) Inventors: Michael J. Knieser, Richmond Heights, OH (US); Robert J. Kretschmann, Bay Village, OH (US); Mark A. Lucak, Hudson, OH (US); Richard D. Harris, Solon, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 10/002,725

(22) Filed: Oct. 25, 2001

(65) Prior Publication Data

US 2003/0082928 A1 May 1, 2003

(51) Int. Cl.$^7$ .............................................. H01L 21/00
(52) U.S. Cl. ....................................................... 438/48
(58) Field of Search .............................. 216/2, 33, 75, 216/79, 99, 100; 361/277; 438/22, 48, 49, 50

(56) References Cited

U.S. PATENT DOCUMENTS

| | | | |
|---|---|---|---|
| 5,413,668 A | * 5/1995 | Aslam et al. .................. 216/2 |
| 5,578,976 A | 11/1996 | Yao | |
| 5,600,190 A | * 2/1997 | Zettler ................. 310/40 MM |
| 5,761,350 A | 6/1998 | Koh | |
| 5,783,340 A | 7/1998 | Farino et al. | |
| 5,804,314 A | 9/1998 | Field et al. | |
| 5,903,380 A | 5/1999 | Motamedi et al. | |
| 5,959,516 A | 9/1999 | Chang et al. | |
| 5,995,688 A | 11/1999 | Aksyuk et al. | |
| 6,046,066 A | 4/2000 | Fang et al. | |
| 6,071,426 A | 6/2000 | Lee et al. | |
| 6,094,102 A | 7/2000 | Chang et al. | |
| 6,100,477 A | 8/2000 | Randall et al. | |
| 6,114,794 A | 9/2000 | Dhuler et al. | |
| 6,137,206 A | 10/2000 | Hill | |
| 6,159,385 A | 12/2000 | Yao et al. | |
| 6,188,322 B1 | 2/2001 | Yao et al. | |
| 6,232,841 B1 | 5/2001 | Bartlett et al. | |
| 6,232,847 B1 | 5/2001 | Marcy V et al. | |
| 6,348,788 B1 | 2/2002 | Yao et al. | |

OTHER PUBLICATIONS

Toumazou, C. et al., n–step Charge Injection Cancellation Scheme for Very Accurate Switched Current Circuits, Electronic Letters, V.30 (9) 680–681: 1994.

Emmerich, H., et al., A Novel Micromachined Magnetic–Field Sensor, MEMS 99 IEEE Conference, Jan. 17–21, 1999, IEEE Catalog No. 99ch36291c.

Madou, Marc, Fundamentals of Microfabrication, Chapters 2–4, CRC Press LLC, Boca Raton, FL: 1997.

Kovacs, Gregory T.A., Micromachined Transducers Sourcebook, Table of Contents, pp. 77–119 and Index, WCB McGraw–Hill, U.S.A.: 1998.

Teegarden, Darrell et al., How to Model and Simulate Microgyroscope Systems, IEEE Spectrum, 66–75, Jul. 1998.

Emmerich, Harald et al., Magnetic Field Measurements with a Novel Surface Micromachined Magnetic–Field Sensor, IEEE Transactions on Electron Devices, V. 47 (5) 972–977, May 2000.

(List continued on next page.)

Primary Examiner—Kamand Cuneo
Assistant Examiner—Asok Kumar Sarkar
(74) Attorney, Agent, or Firm—Adam J. Forman; Alexander M. Gerasimow; William R. Walbrun

(57) ABSTRACT

A method is presented for fabricating an electrically isolated MEMS device having a conductive outer MEMS element, and an inner movable MEMS element spaced apart from the conductive outer MEMS element. The inner element includes a nonconductive base having a plurality of conductive structures extending therefrom. The conductive components are formed by plating a conductive material into a pre-formed mold which defines the shape of the conductor.

11 Claims, 3 Drawing Sheets

OTHER PUBLICATIONS

McGruer, N.E. et al., Electrostatically Actuated Microswitches; Scaling Properties, Solid–State Sensor and Actuator Workshop, Hilton Head Island, South Carolina, Jun. 8–11, 1998, pp. 132–135.

Miyajima, Hiroshi et al., High–Aspect–Ratio Photolithography for MEMS Applications, J. of Microelectromechanical Sys., V.4(4) 220–229, Dec. 1995.

Lu, Crist et al., A Monolithic Surface Micromachined Accelerometer with Digital Output, IEEE J. of Solid State Circuits, V. 30(12) 1367–1373, Dec. 1995.

Chen, Ming–Jer et al., Weak Inversion Charge Injection in Analog MOS Switches, IEEE J. of Solid–State Circuits, V. 30(5) 604–606, May 1995.

Lemkin, Mark A. et al., A Fully Differential Lateral S? Accelerometer with Drift Cancellation Circuitry, Solid–State Sensor and Actuator Workshop, Hilton Head, South Carolina, Jun. 2–6, 1996, pp. 90–93.

Boser, Bernhard E. et al., Surface Micromachined Accelerometers, IEEE J. of Solid–State Circuits, V. 31 (3) 366–375, Mar. 1996.

Fedder, Gary K. et al., Multimode Digital Control of a Suspended Polysilicon Microstructure, J. of Microelectromechanical Sys., V. 5(4) 283–297, Dec. 1996.

Noriege, Gerardo, Sigma–Delta A/D Converters–Audio and Medium Bandwidths, Technical Notes–DT3 from RMS Instruments website: www.rmsinst.com, 6 pages, Feb. 1996.

Internet page: Decimator Filter DLL, NeuroDimension Inc.: www.nd.com , May 31, 2001.

U.S. patent application No.: 09/406,654, filed on Sep. 27, 1999.

U.S. patent application No.: 09/400,125, filed on Sep. 21, 1999.

U.S. patent application No.: 09/406,509, filed on Sep. 28, 1999.

U.S. patent application No.: 09/955,493, filed on Sep. 18, 2001.

U.S. patent application No.: 09/955,494, filed on Sep. 18, 2001.

U.S. patent application No.: 09/675,862, filed Sep. 29, 2000.

* cited by examiner

METHOD FOR FABRICATING AN ISOLATED MICROELECTROMECHANICAL SYSTEM DEVICE

CROSS-REFERENCE TO RELATED APPLICATIONS

STATEMENT REGARDING FEDERALLY SPONSORED RESEARCH OR DEVELOPMENT

BACKGROUND OF THE INVENTION

1. Field of the Invention

The present invention relates to microelectromechanical systems (MEMS) and, in particular, relates to the fabrication of electrically isolated MEMS devices using plating techniques.

2. Discussion of the Related Art

Microelectromechanical systems (MEMS) components are being progressively introduced into many electronic circuit applications and a variety of micro-sensor applications. Examples of MEMS components are electromechanical motors, radio frequency (RF) switches, high Q capacitors, pressure transducers and accelerometers. In one application, the MEMS device is an accelerometer having a movable component that, in response to acceleration, is actuated so as to vary the size of a capacitive air gap. Accordingly, the current output of the MEMS device provides an indication of the strength of the external stimulus.

One current method of fabricating such components, often referred to as surface micro-machining, uses a sacrificial layer, such as silicon dioxide, that is deposited and bonded onto a substrate, such as single crystal silicon which has been covered with a layer of silicon nitride. A MEMS component material, for example polycrystalline silicon, is then deposited onto the sacrificial layer, followed by a suitable conductor, such as aluminum, to form an electrical contact with the ambient environment. The silicon layer is then patterned by standard photolithographic techniques and then etched by a suitable reactive ion etching plasma or by wet chemistry to define the MEMS structure and to expose the sacrificial layer, which may comprise silicon dioxide. The sacrificial layer is then etched to release the MEMS component. This leaves only a single material, the structural material.

One significant disadvantage associated with current surface fabrication techniques involves the lack of electrical isolation that is achieved. The present inventors have discovered that a MEMS device may be used as a current or voltage sensor, in which the device may receive high voltages at one end of the device, and output an electrical signal at the other end of the device to, for example, a sensor. The output could be a function of the capacitance of the MEMS device, as determined by the position of a movable MEMS element with respect to a stationary element. However, because the entire movable MEMS element achieved using conventional surface fabrication techniques is conductive, the input and output ends of the MEMS device are not sufficiently isolated from one another, thereby jeopardizing those elements disposed downstream of the MEMS output.

Another significant disadvantage associated with current surface fabrication techniques is that the process is inherently limited to thin structural layers (on the order of 1 to 2 $\mu$m) due to stresses which may be introduced during the fabrication. The thinness of the layers limits the amount of capacitance that can be obtained in the sensor portion of the MEMS device, and thus limits the magnitude of any output signal. This in turn limits the overall resolution obtainable It is therefore desirable to provide a method for fabricating a MEMS device using surface fabrication techniques having greater thickness than that currently achieved to enhance sensitivity, while providing sufficient electrical isolation for the device.

BRIEF SUMMARY OF THE INVENTION

The present inventors have recognized that a MEMS device may be fabricated using an insulating material, a sacrificial material, a mold material, and a conducting mechanical structural layer that may be plated onto an insulating substrate.

In accordance with one aspect of the invention, a method for fabricating a MEMS device, comprising the steps of providing a substrate having an upper surface, and depositing a sacrificial layer onto the upper surface of the substrate. A nonconductive layer is then deposited onto the upper surface of the sacrificial layer. Next, a mold is deposited onto the substrate, wherein the mold has at least one void aligned with the insulating layer. A conductive material is then deposited into the at least one void to form conductive elements extending from the nonconductive layer. Finally, the mold and sacrificial layer are removed to release a movable element including the nonconductive layer and conductive layer from the substrate.

The conductive material may be electroplated or electrolessplated onto the nonconductive layer.

All of the aforementioned aspects are not necessary to carry out the invention. Furthermore, these and other aspects of the invention are not intended to define the scope of the invention for which purpose claims are provided. In the following description, reference is made to the accompanying drawings, which form a part hereof, and in which there is shown by way of illustration, a preferred embodiment of the invention. Such embodiment also does not define the scope of the invention and reference must be made therefore to the claims for this purpose.

BRIEF DESCRIPTION OF THE DRAWINGS

Reference is hereby made to the following figures in which like reference numerals correspond to like elements throughout, and in which.

DETAILED DESCRIPTION OF THE INVENTION

Figure 1:
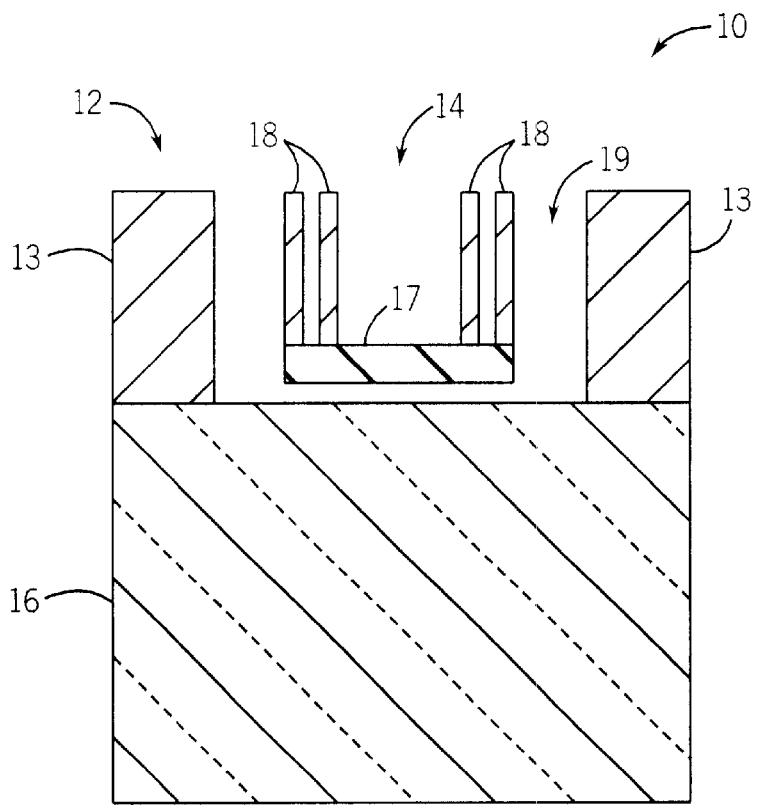
FIG. 1 is a schematic sectional side elevation view of a MEMS device constructed in accordance with a preferred embodiment of the invention.

Referring initially to FIG. 1, a MEMS device 10 includes a stationary MEMS element 12 and a movable MEMS element 14, both attached to a substrate 16. The substrate 16 may be either conducting or insulating, depending on the intended application, and may comprise glass, high resistivity silicon, crystalline sapphire, crystalline silicon, polycrystalline silicon, silicon carbide, or ceramic such as alumina, aluminum nitride, and the like, or gallium arsenide. In fact, the substrate may comprise any material whatsoever that is suitable for supporting a MEMS device. In the embodiment shown in FIG. 1, the stationary MEMS element 12 comprises a pair of stationary conductive members 13 which extend outwardly from the substrate. The movable MEMS element 14 includes a base layer 17 which supports separated conductive members 18 that extend outwardly from the base 17. Movable element 14 is disposed between the stationary members 13. It should be appreciated by those having ordinary skill in the art that movable MEMS element 14 is a beam that is supported at its distal ends by, for example, the substrate such that the middle portion of element 14 is free and movable relative to the stationary members 13, as illustrated.

It should be appreciated by one having ordinary skill in the art that FIG. 1 illustrates a portion of a MEMS structure 10, and that inner MEMS element 14 is connected to substrate 16 at its two distal ends, as disclosed in patent application Ser. No. 09/805,410 filed on Mar. 13, 2001 and entitled "Microelectricalmechanical System (MEMS) Electrical Isolator with Reduced Sensitivity to Internal Noise" the disclosure of which is hereby incorporated by reference. Accordingly, while the outer portions of movable element 14 are connected to the substrate, an elongated section of element 14 is suspended and free from the substrate, thereby permitting deflection of the free portion of the movable MEMS element with respect to the substrate 16. The stationary members 13 are separated from the moveable MEMS element 14 by a variable size gap 19, which could be the gap between the adjacent plates of a detection capacitor, as will become more apparent from the description below. The size of gap 19 changes as the movable element deflects in response to a stimulus.

In the MEMS device 10 illustrated in FIG. 1, there are two different structural materials that remain after the movable element 14 is released from the substrate 16. In particular, an insulating material that forms the base layer 17 and a conducting layer that forms the other portions of the device 13 and 18. As such, fabrication of devices of this type utilizes at least three unique materials, in addition to the substrate: a conducting material, an insulating material, and at least one sacrificial material.

If base layer 17 is formed utilizing an insulating material, as is the case in accordance with the preferred embodiment, the conductive members 18 become electrically isolated from each other, thereby minimizing the risk that an electrical input will conduct across the device 10, which would jeopardize those elements disposed downstream of the MEMS output, in a useful circuit application. The insulation layer 17 thus provides sufficient electrical isolation across the movable element 14, thereby rendering the device 10 usable, for example, as a current or voltage sensor.

The MEMS device 10 could therefore perform any function suitable for a MEMS application. For example, the device could comprise an accelerometer whose movable MEMS element 14 is a beam that deflects in response to the external stimulus, such as an acceleration or vibration of the device 10. Accordingly, as the size of the gaps 19 vary, so will the output capacitance, thereby providing a measurement of the amount of deflection of the movable MEMS element 14. A measurement of the amount of acceleration may thereby be obtained by measuring the capacitance of the device. The device 10 constructed in accordance with the present invention could furthermore incorporate a wafer level cap and electrical traces connected to the stationary members 13, as is described in U.S. Patent Application filed on Sep. 26, 2001 and entitled "Method for Constructing an Isolated Microelectromechanical System (MEMS) Device Using Surface Fabrication Techniques" the disclosure of which is hereby incorporated by reference as if set forth in its entirety herein.

The MEMS device 10 schematically illustrated in FIG. 1 may be fabricated in accordance with several embodiments of the invention that utilize plating processes, as will now be described.

Figure 2:
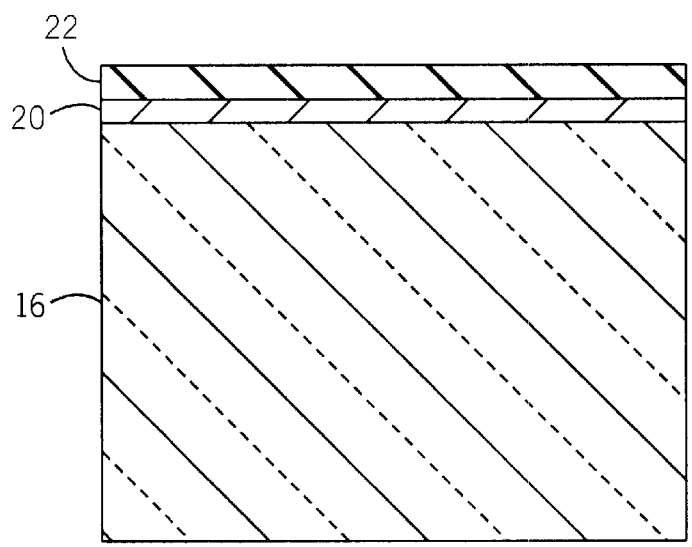
FIG. 2 is a sectional side elevation view of a structure having a substrate, sacrificial layer, and insulating layer that is used to fabricate the MEMS device illustrated in FIG. 1 in accordance with one embodiment of the invention.

In particular, referring now to FIG. 2, the fabrication process begins by providing a substrate 16 that is insulating and comprises either glass or high resistivity silicon in accordance with the preferred embodiment. Other materials, including conducting materials, could be substituted for the substrate material, depending on the intended application of the MEMS device. Several layers are subsequently deposited onto the substrate 16. The first layer 20 to be deposited will ultimately form a sacrificial release layer and comprises silicon nitride in the preferred embodiment. A skilled artisan will appreciate that any alternative material that is selectively etchable could also be used. The second layer 22 to be deposited will form an insulating base layer and comprises silicon dioxide in the preferred embodiment. The deposition of these materials is well known, and could be achieved by chemical vapor deposition (CVD), plasma enhanced chemical vapor deposition (PECVD), or similar techniques well known to those skilled in the art. The thickness of each layer is selected in anticipation of the desired height of the final MEMS device, and may be on the order of 1–3 microns.

Figure 3:
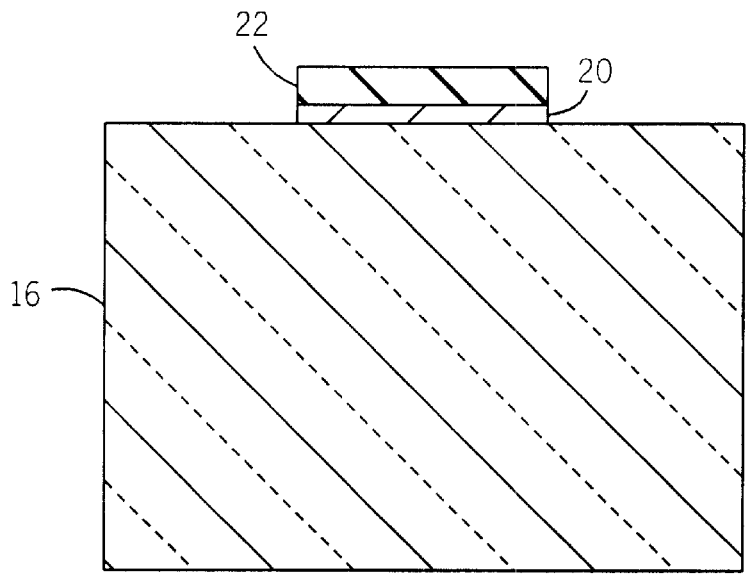
FIG. 3 is a sectional side elevation view of the structure illustrated in FIG. 2 having a portion of the insulating and sacrificial layers removed.

Referring now to FIG. 3, once the layers 20 and 22 are deposited, they are patterned by standard photolithographic techniques. In particular, photoresist is applied to the top surface of the structure and patterned. The insulating layer 22 is selectively anisotropically etched, followed by selective anisotropic etching of the sacrificial layer 20, and finally the photoresist is removed which reveals the insulating base 17, lying on top of patterned sacrificial layer 20.

In preparation for an electroplating step, the top surface of the structure may be coated with a shorting layer that is compatible with the metal which will be electroplated. The shorting layer will later facilitate the plating process. For example, when electroplating gold, a tin/gold or a chromium/gold bilayer shorting layer is used. This electrically connects regions where metal deposition is desired. After plating, the gold shorting layer can be removed with a short $KI_3$ solution and the tin, for example, can be removed using a buffered HF solution.

In preparation for an electrolessplating step, the top surface of the structure may be coated with a pre-treated catalyst to induce the electroless plating reduction reaction.

Figure 4:
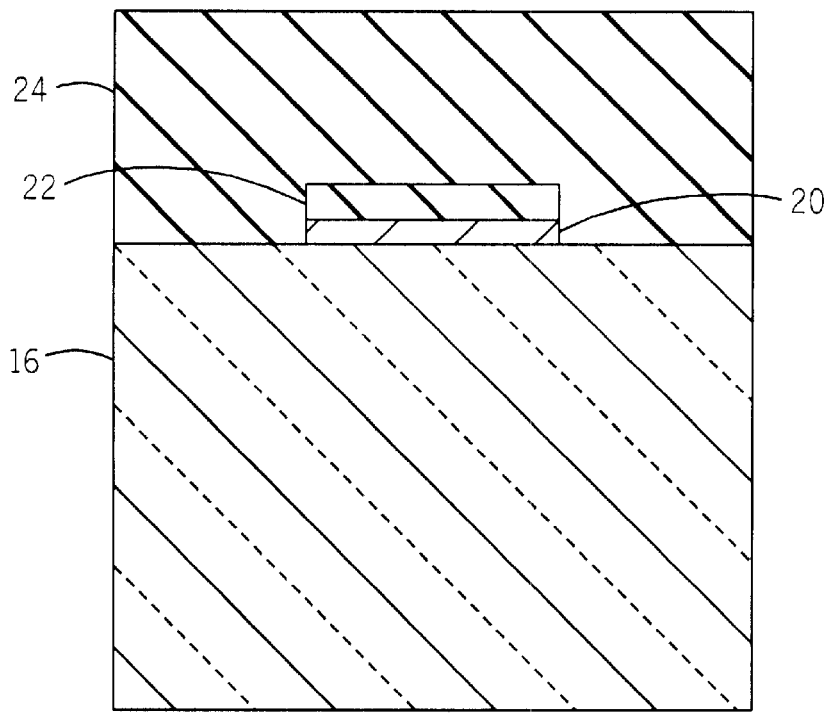
FIG. 4 is a sectional side elevation view of the structure illustrated in FIG. 3 having a plating mold attached thereto.

Referring to FIG. 4, the structure is now coated with the mold material 24, which may comprise a photoresist or other photoactivated polymer material in accordance with the preferred embodiment. Because the plating process is a relatively low temperature process, a high temperature material like that needed for the sacrificial layer is not required for the mold material. In addition, commercial photoresists exist that can be applied to thickness up to and above 10 microns. This increased thickness is beneficial as it will allow the plated conductive layer to achieve a greater thickness. A skilled artisan will appreciate that the mold material could also be an inorganic material, such as the same material employed for the sacrificial material. However, the thickness of such materials is generally limited to 1–3 microns which will limit the overall height of the final conducing layer.

Figure 5:
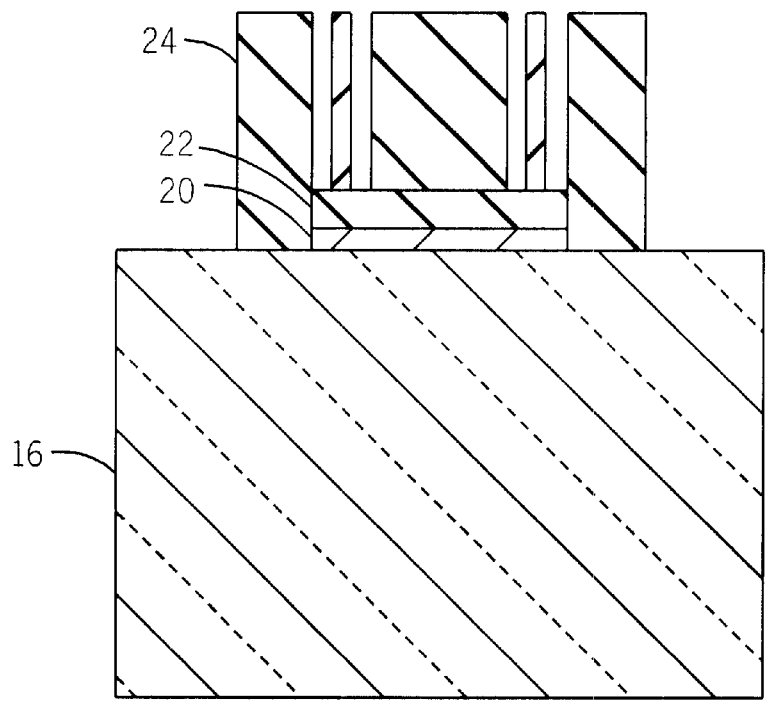
FIG. 5 is a sectional side elevation view of the structure illustrated in FIG. 4 after patterning the mold using standard photolithographic techniques.

The photoresist is then patterned with standard photolithographic processes to result in a mold pattern. That is, the photoresist is removed in the areas where the plating is desired, as shown in FIG. 5. Gaps are thereby formed in the mold 24 that will provide the structure for the fabrication of conductive members 18.

Figure 6:
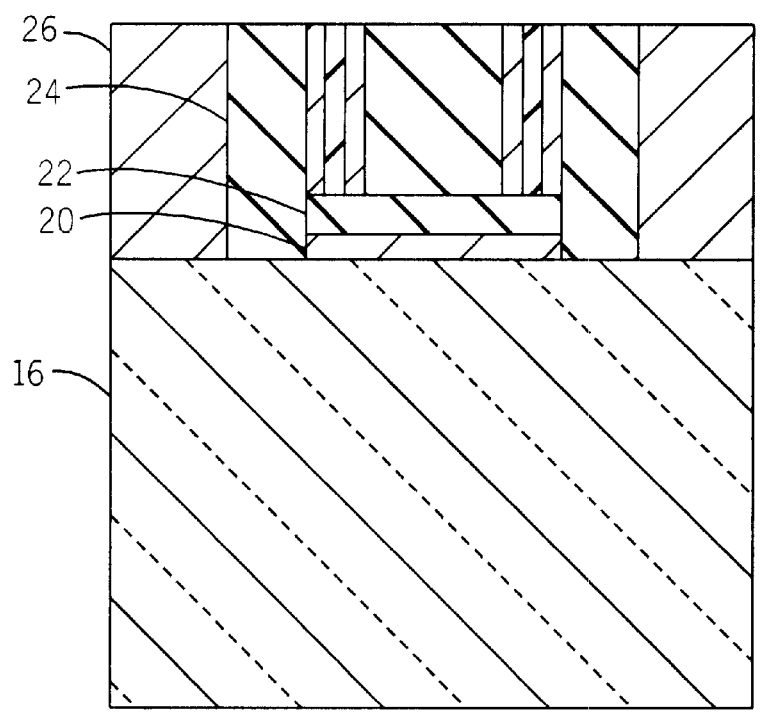
FIG. 6 is a sectional side elevation view of the structure illustrated in FIG. 5 after plating a material onto the insulating layer.

Referring now to FIG. 6, the conducting material is plated onto the insulating layer 22 using standard plating processes. Conducting material is further plated onto the surface of substrate 16 to form the stationary conductive members 13. The conducting material could be nickel, gold, copper, or any other suitably conductive metal which can be plated. The metal fills the cavities in the mold and attaches to layers 22 and substrate 16. Finally the mold material 24 is etched away and the sacrificial layer 20 is etched away using standard techniques, thereby leaving the final released structure depicted in FIG. 1.

It should be appreciated that the embodiments described herein comprise various layers of conductive and nonconductive materials. While these materials are identified in accordance with the preferred embodiment, it should be appreciated that any alternative materials suitable for use in the intended MEMS application, and that are selectively etchable if necessary, could be substituted for the disclosed materials. For example, sacrificial layer 20 could be silicon dioxide and the insulating layer 22 could be silicon nitride with no change in functionality.

The above has been described as preferred embodiments of the present invention. It will occur to those that practice the art that many modifications may be made without departing from the spirit and scope of the invention. For example, it is appreciated by one having ordinary skill in the art that the structure of the movable MEMS element 14 may differ so long as it is electrically isolated and includes a conductive member that is operable to create, for example, a capacitance that varies in accordance with the motion. Accordingly, variations of the embodiments described herein will become apparent to those having ordinary skill in the art, and such variations are within the scope of the present invention, as defined by the following claims.

We claim:

1. A method for fabricating a MEMS device, comprising the steps of:

(a) providing a substrate having an upper surface;
   (b) depositing a sacrificial layer onto the upper surface of the substrate, wherein the sacrificial layer has an upper surface;
   (c) depositing a nonconductive layer onto the upper surface of the sacrificial layer;
   (d) depositing a mold onto the substrate, wherein the mold has at least one void aligned with the nonconductive layer;
   (e) depositing conductive material into the at least one void to form conductive elements extending from the nonconductive layer;
   (f) removing the mold; and
   (g) removing the sacrificial layer to release a movable element including the nonconductive layer and conductive material from the substrate.

2. The method as recited in claim 1, wherein step (e) further comprises electroplating the conductive material.

3. The method as recited in claim 2, wherein step (e) further comprises electrolessplating the conductive material.

4. The method as recited in claim 2, wherein step (e) further comprises coating the nonconductive layer with a shorting layer prior to plating.

5. The method as recited in claim 3, wherein step (d) further comprises coating the nonconductive layer with a catalyst prior to plating.

6. The method as recited in claim 1, wherein the nonconductive layer is selected from the group consisting of silicon nitride and silicon dioxide.

7. The method as recited in claim 1, wherein the substrate is selected from the group consisting of glass, high resistivity silicon, crystalline sapphire, crystalline silicon, polycrystalline silicon, silicon carbide, ceramic, and gallium arsenide.

8. The method as recited in claim 1, wherein the conductive material comprises a metal.

9. The method as recited in claim 8, wherein the conductive layer is selected from the group consisting of nickel, gold, and copper.

10. The method as recited in claim 8, wherein the nonconductive layer and conductive material are arranged in a manner such that a first portion of the movable element is electrically isolated from a second portion of the movable element.

11. The method as recited in claim 1, further comprising the step of depositing a second conductive material onto the substrate, wherein the second conductive material is spaced from the movable element by a variable size gap.

* * * * *